(12) United States Patent
Iino

(10) Patent No.: US 12,030,024 B2
(45) Date of Patent: Jul. 9, 2024

(54) DILUTE CHEMICAL SUPPLY DEVICE

(71) Applicant: KURITA WATER INDUSTRIES LTD., Tokyo (JP)

(72) Inventor: Hideaki Iino, Tokyo (JP)

(73) Assignee: KURITA WATER INDUSTRIES LTD., Tokyo (JP)

( * ) Notice: Subject to any disclaimer, the term of this patent is extended or adjusted under 35 U.S.C. 154(b) by 29 days.

(21) Appl. No.: 17/637,668

(22) PCT Filed: Sep. 15, 2020

(86) PCT No.: PCT/JP2020/034957
§ 371 (c)(1),
(2) Date: Feb. 23, 2022

(87) PCT Pub. No.: WO2021/181730
PCT Pub. Date: Sep. 16, 2021

(65) Prior Publication Data
US 2022/0410090 A1    Dec. 29, 2022

(30) Foreign Application Priority Data

Mar. 10, 2020 (JP) ................................. 2020-041111

(51) Int. Cl.
*B01F 23/40*      (2022.01)
*B01F 35/21*      (2022.01)
(Continued)

(52) U.S. Cl.
CPC ........ *B01F 23/483* (2022.01); *B01F 35/2112* (2022.01); *B01F 35/2132* (2022.01);
(Continued)

(58) Field of Classification Search
CPC ............ B01F 23/483; B01F 35/717613; B01F 35/2211; B01F 35/2112; B01F 35/2132; B01F 2102/24; H01L 21/6704
See application file for complete search history.

(56) References Cited

U.S. PATENT DOCUMENTS 6,572,255 B2 *   6/2003   Husher ................. B01F 35/834
                                                         366/132
6,705,358 B1 *   3/2004   Tortorici, Jr. ........... B01F 35/88
                                                         141/105
(Continued)

FOREIGN PATENT DOCUMENTS

CN      101878064 B  *  8/2013   ............... A23L 2/54
JP      S61-15729 A     1/1986
(Continued)

OTHER PUBLICATIONS

International Search Report mailed Nov. 24, 2020 issued in corresponding international patent application No. PCT/JP2020/034957 (and English translation).

(Continued)

*Primary Examiner* — Timothy L Maust
(74) *Attorney, Agent, or Firm* — Posz Law Group, PLC

(57) ABSTRACT

The dilute chemical solution supply device (1) comprises: a dilute chemical solution preparation unit (2) that prepares a dilute chemical solution (W1); a reservoir (3) for the prepared dilute chemical solution; a dilute chemical solution adjustment/supply mechanism (4) that supplies, as washing water (W2), the dilute chemical solution (W1) stored in the reservoir (3) to a plurality of single-wafer type washers (5A, 5B, and 5C); and a return mechanism that is connected to each of the single-wafer type washers (5A, 5B, and 5C) and refluxes excess water from the single-wafer type washers to the reservoir (3). According to such a dilute chemical solution supply device, it is possible to accurately adjust the (Continued)

concentration of the solute of the dilute chemical solution and suppress the discharge of excess water, and the dilute chemical solution supply device is thus suitable for washing of wafers, etc.

13 Claims, 3 Drawing Sheets

(51) Int. Cl.
*B01F 35/221* (2022.01)
*B01F 35/71* (2022.01)
*B01F 101/24* (2022.01)
*H01L 21/67* (2006.01)

(52) U.S. Cl.
CPC .. *B01F 35/2211* (2022.01); *B01F 35/717613* (2022.01); *H01L 21/6704* (2013.01); *B01F 2101/24* (2022.01)

(56) References Cited

U.S. PATENT DOCUMENTS

| | | | | |
|---|---|---|---|---|
| 6,845,298 | B2* | 1/2005 | Nelson | B01F 35/2117 |
| | | | | 700/285 |
| 8,641,018 | B2* | 2/2014 | Sonnenrein | B01F 25/23 |
| | | | | 99/275 |
| 9,302,298 | B2* | 4/2016 | Tokoshima | B01F 35/2132 |
| 10,406,493 | B2* | 9/2019 | Hayashi | B01F 25/31 |
| 2010/0122713 | A1* | 5/2010 | Tanaka | A23B 7/152 |
| | | | | 134/198 |
| 2013/0098408 | A1* | 4/2013 | Tanaka | A61L 2/183 |
| | | | | 134/184 |
| 2019/0067048 | A1 | 2/2019 | Takaki et al. | |
| 2020/0131022 | A1 | 4/2020 | Sasaki | |

FOREIGN PATENT DOCUMENTS

| | | |
|---|---|---|
| JP | 2000-271549 A | 10/2000 |
| JP | 2000-354857 A | 12/2000 |
| JP | 2006-105751 A | 4/2006 |
| JP | 2018-206998 A | 12/2018 |
| JP | 2019-147112 A | 9/2019 |
| JP | 2019-192864 A | 10/2019 |
| WO | 2017/135064 A1 | 11/2007 |
| WO | 2008/139653 A1 | 11/2008 |

OTHER PUBLICATIONS

Office Action mailed Mar. 2, 2021 issued in corresponding priority document Japanese patent application No. 2020-041111 (and machine Translation).

Office Action mailed Nov. 17, 2020 issued in corresponding priority document Japanese patent application No. 2020-041111 (and machine Translation).

* cited by examiner

DILUTE CHEMICAL SUPPLY DEVICE

CROSS REFERENCE TO RELATED APPLICATIONS

This application is a U.S. national stage application of PCT/JP2020/034957 filed on Sep. 15, 2020 and is based on Japanese Patent Application No. 2020-041111 filed on Mar. 10, 2020, the contents of which are incorporated herein by reference.

TECHNICAL FIELD

The present invention relates to a dilute chemical solution supply device capable of stably and efficiently supplying a dilute chemical solution that contains solutes such as alkali, oxidant, and gas at very low concentrations and that is effective in a washing/rinsing step for semiconductor wafers and other similar materials.

BACKGROUND ART

In semiconductor production steps, the washing step for silicon wafers for semiconductors may use water in which solutes effective for controlling the pH and the redox potential are dissolved in ultrapure water at very low concentrations (such water may be referred to as dilute chemical solution). This dilute chemical solution uses ultrapure water as the basic material, to which acid/alkali and/or oxidant/reductant may be added in order to impart liquid properties such as the pH and the redox potential that match the purpose of each step such as a washing step or a rinsing step. In this case, their additive amounts are preferably the minimum necessary amounts so as not to have an excessive effect on the silicon wafers. Here, for the pH adjustment, a method of adding a small amount of HCl or $NH_4OH$ is generally used (chemical feeding). Additionally or alternatively, when the gas is dissolved in ultrapure water to adjust the pH or maintain the inactivation, $CO_2$ gas and/or N2 gas may be dissolved. Additionally or alternatively, when it is desired to impart the reduction property, $H_2$ gas may be dissolved.

Practical methods of adding such a chemical solution include a method using a pump such as a plunger pump and a method of pressurizing the chemical solution filling a closed container with an inert gas such as $N_2$ gas and pushing out the chemical solution.

In this case, if the flow volume of ultrapure water is constant, the chemical feeling is easy to obtain a desired solute concentration, but in a washer in which the dilute chemical solution is actually used, particularly in a single-wafer type washer having a plurality of washing chambers, the flow volume of the dilute chemical solution fluctuates irregularly because the supply/stop of the water poured onto the wafer is controlled by opening and closing a plurality of valves. In response to this fluctuation, various schemes are adopted for the control such as proportional control of the additive amount of the chemical solution to the flow volume of ultrapure water or PID control with a received signal from a concentration monitor so that the solute concentration of the dilute chemical solution falls within a desired range.

SUMMARY OF THE INVENTION

Problems to be Solved by the Invention

As described above, the flow volume fluctuates irregularly in a single-wafer type washer, but the chemical feeding control that can sufficiently follow this irregular flow volume fluctuation cannot be realized, which results in a problem in that the liquid quality of the washing/rinsing water poured onto the wafer has to be controlled in a wide range deviating from the ideal value range.

In this context, it is conceivable to give priority to stabilizing the concentration of the dilute chemical solution and continue to produce and supply an excessive amount of the dilute chemical solution under a certain condition, but in this case, a large amount of the excess dilute chemical solution will be discharged. In a recent single-wafer type washer having a plurality of washing chambers, the difference between the maximum flow volume and minimum flow volume of the dilute chemical solution required instantaneously is large, but if a larger amount of the dilute chemical solution than the maximum flow volume of the dilute chemical solution is continuously supplied, a considerable amount of excess water (excess dilute chemical solution) will be discharged, thus leading to problems such as a burden on the drainage facilities, excessive discharge of the dilute chemical solution, and excessive consumption of ultrapure water as the basic material.

Reusing excess water (excess dilute chemical solution), in particular excess water after passing through a heating device, may not be suitable from the viewpoint of strict concentration control because the concentration of an oxidant having oxidative properties, such as $H_2O_2$ or $O_3$, tends to fluctuate due to its spontaneous decomposition and decomposition caused by a reaction with another chemical solution. Likewise, in the excess water of the gas-dissolved water in which $H_2$ gas, $CO_2$ gas, or the like is dissolved, there is a problem in that the concentration of the dissolved gas lowers until the gas-dissolved water is returned to the reservoir via a gas-permeable tube and/or a tank.

The present invention has been made in view of the above problems, and an object of the present invention is to provide a dilute chemical solution supply device that can accurately adjust the concentrations of the solutes of the dilute chemical solution and suppress the discharge of excess water and that is suitable for washing wafers and the like.

Means for Solving the Problems

To achieve the above-described object, the present invention provides a dilute chemical solution supply device comprising: a dilute chemical solution production unit that adds a predetermined amount of a chemical solution to a flow volume of ultrapure water thereby to produce a dilute chemical solution having a predetermined concentration of the chemical solution; a reservoir that stores the produced dilute chemical solution; a dilute chemical solution supply mechanism that supplies the dilute chemical solution to a use point; and a return mechanism comprising: a return pipe that returns an excess dilute chemical solution at the use point to the reservoir; and a concentration detection means for the chemical solution component provided in a middle of the return pipe (Invention 1).

According to the invention (Invention 1), a predetermined amount of the chemical solution is added to ultrapure water to produce the dilute chemical solution having a predetermined concentration, which is once stored in the reservoir and can be supplied from the reservoir to the use point. Then, the excess dilute chemical solution is returned to the reservoir after detecting the concentration of the chemical solution component and can be reused by appropriately managing the concentration of the dilute chemical solution in the reservoir.

In the above invention (Invention 1), the dilute chemical solution supply mechanism may be preferably provided with a gas dissolution means that dissolves a predetermined gas component in the dilute chemical solution supplied from the reservoir (Invention 2).

According to the invention (Invention 2), a chemical solution in which the gas is further dissolved in the dilute chemical solution can be obtained.

In the above invention (Invention 1, 2), the dilute chemical solution production unit may be preferably provided with a plunger pump that adds the chemical solution (Invention 3).

According to the invention (Invention 3), the plunger pump may control the additive amount of the chemical solution in a small amount with respect to the flow volume of the ultrapure water thereby to allow the dilute chemical solution having a predetermined concentration to be stably supplied to the reservoir.

In the above invention (Invention 1, 2), the dilute chemical solution production unit may be preferably provided with a chemical solution addition device, wherein the chemical solution addition device comprises: a closed tank that stores the chemical solution; and an inert gas supply means that supplies an inert gas to the closed tank (Invention 4).

According to the invention (Invention 4), the dilute chemical solution having a predetermined concentration can be stably supplied to the reservoir by pushing out the chemical solution with the inert gas to the flow volume of the ultrapure water to supply a predetermined amount of the chemical solution.

In the above invention (Invention 1 to 4), the reservoir may be provided with a level sensor that detects a water level of the reservoir, and it is preferred that production/stop of the dilute chemical solution in the dilute chemical solution production unit can be controlled based on the water level information of the reservoir obtained by the level sensor (Invention 5).

According to the invention (Invention 5), when the water level of the reservoir falls below a certain level, the dilute chemical solution production unit can be operated to efficiently produce the dilute chemical solution, and the generation of excess water can be eliminated.

In the above invention (Invention 1 to 5), the reservoir may be preferably provided with a discharge mechanism (Invention 6).

According to the invention (Invention 6), the dilute chemical solution having a predetermined concentration can be stored in the reservoir by discharging the dilute chemical solution without storing it in the reservoir until the dilute chemical solution stabilizes at the predetermined concentration, and the concentration of the dilute chemical solution supplied to the use point can therefore be controlled accurately.

In the above invention (Invention 5, 6), it is preferred that a production amount of the dilute chemical solution in the dilute chemical solution production unit can be adjusted (Invention 7).

According to the invention (Invention 7), the water level of the reservoir can be efficiently controlled by adjusting the production amount of the dilute chemical solution in accordance with the water level of the reservoir.

In the above invention (Invention 1 to 7), the reservoir may preferably comprise two or more reservoirs that are provided in parallel (Invention 8).

According to the invention (Invention 8), the concentration of the dilute chemical solution supplied to the use point can be accurately controlled by differentiating the reservoir for supplying the dilute chemical solution to the use point and the reservoir for storing the dilute chemical solution.

In the above invention (Invention 2 to 8), a gas removal means that removes a dissolved gas in the dilute chemical solution may be preferably provided upstream the gas dissolution means (Invention 9).

According to the invention (Invention 9), the gas supplied from the gas dissolution means can be accurately and efficiently dissolved in the dilute chemical solution.

Advantageous Effect of the Invention

According to the dilute chemical solution supply device of the present invention, the concentration of the chemical solution component of the excess dilute chemical solution after being supplied to the use point can be detected and then the dilute chemical solution can be returned to the reservoir; therefore, the excess dilute chemical solution can be reused by appropriately managing the concentration of the dilute chemical solution in the reservoir. This can reduce the amount of ultrapure water used as the raw water.

EMBODIMENTS FOR CARRYING OUT THE INVENTION

First Embodiment

«Dilute Chemical Solution Supply Device»

Figure 1:
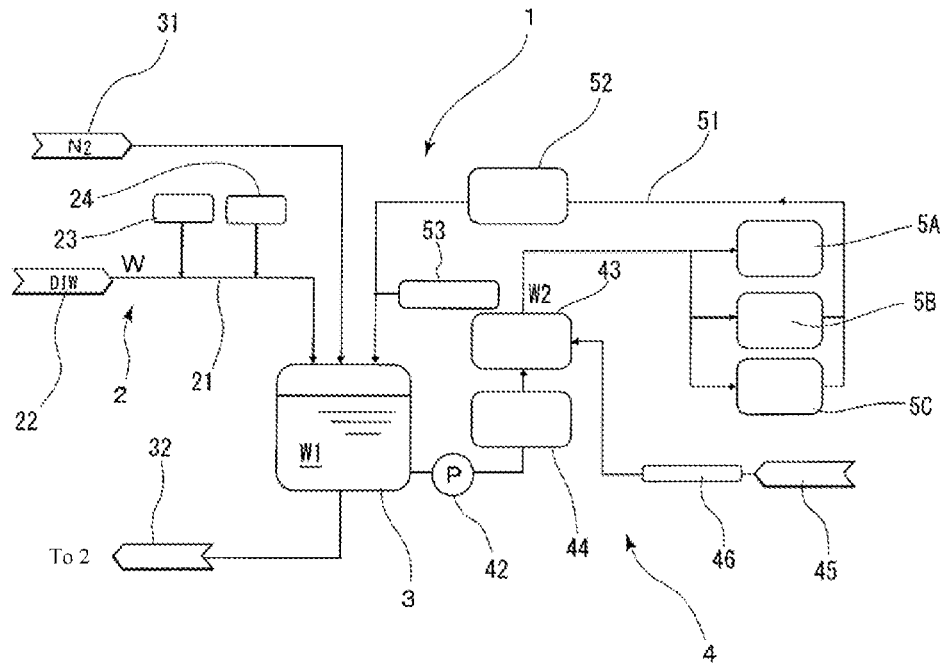
FIG. 1 is a flow diagram illustrating a dilute chemical solution supply device according to a first embodiment of the present invention.

FIG. 1 illustrates a dilute chemical solution supply device according to the first embodiment of the present invention. In FIG. 1, the dilute chemical solution supply device 1 comprises: a dilute chemical solution preparation unit 2 that prepares a dilute chemical solution W1; a reservoir 3 for the prepared dilute chemical solution; a dilute chemical solution adjustment/supply mechanism 4 that supplies, as washing water W2, the dilute chemical solution W1 stored in the reservoir 3 to a plurality of single-wafer type washers 5A, 5B, and 5C as use points; and a return mechanism that is connected to the single-wafer type washers 5A, 5B, and 5C and refluxes excess water from the single-wafer type washers to the reservoir 3.

(Dilute Chemical Solution Preparation Unit)

Figure 2:
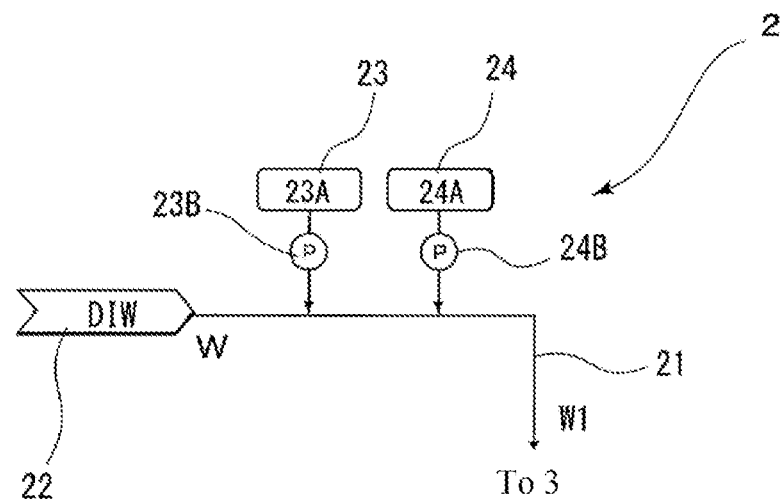
FIG. 2 is a flow diagram illustrating an example of a dilute chemical solution preparation unit of the dilute chemical solution supply device according to the first embodiment.

The dilute chemical solution preparation unit 2 has a dilute chemical solution preparation flow path 21 that communicates with the reservoir 3 and a supply source 22 for ultrapure water (or deionized water; DIW) W; and a first chemical solution supply mechanism 23 and a second chemical solution supply mechanism 24 that are provided in the middle of the dilute chemical solution preparation flow path 21. In the present embodiment, as illustrated in FIG. 2, the first chemical solution supply mechanism 23 is composed of a first chemical solution tank 23A and a plunger pump 23B that adds the first chemical solution, and the second chemical solution supply mechanism 24 is composed of a second chemical solution tank 24A and a plunger pump 24B that adds the second chemical solution. The dilute chemical solution preparation flow path 21 is provided with a flow volume measurement means such as a flow meter (not illustrated).

(Reservoir)

Figure 3:
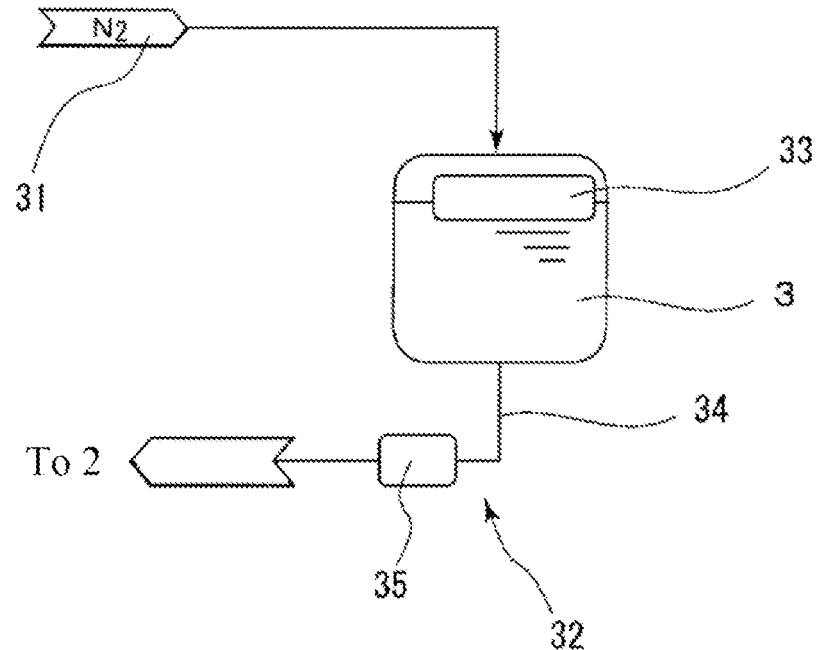
FIG. 3 is a flow diagram illustrating an example of a reservoir of the dilute chemical solution supply device according to the first embodiment.

The reservoir 3 is made of a high-purity material whose elution from the inner wall is at a negligible level so as not to impair the purity of the dilute chemical solution W1. The reservoir 3 is connected to an $N_2$ gas supply mechanism 31 for filling the inside of the reservoir 3 with $N_2$ gas as an inert gas and a return mechanism 32 that discharges the dilute chemical solution in the reservoir 3. In the present embodiment, the reservoir 3 is provided with a level sensor 33 that detects the water level, as illustrated in FIG. 3. In the present embodiment, the return mechanism 32 comprises: a return flow path 34 provided with an opening/closing mechanism (not illustrated); and a removal device 35 such as an ion-exchange resin column provided in the return flow path 34. The return flow path 34 communicates with the dilute chemical solution preparation unit 2 on the downstream side of the removal device 35.

(Dilute Chemical Solution Adjustment/Supply Mechanism)

The dilute chemical solution adjustment/supply mechanism 4 has a dilute chemical solution supply flow path 41 that communicates with the reservoir 3 and the single-wafer type washers 5A, 5B, and 5C, a booster pump 42 as a liquid transfer pump provided in the middle of the dilute chemical solution supply flow path 41, a gas dissolution film 43, and a gas removal film 44 provided upstream the gas dissolution film 43. The gas dissolution film 43 is connected to a dissolution gas source 45 via a mass flow controller (MFC) 46 as a flow volume control means. In the present embodiment, the dilute chemical solution adjustment/supply mechanism 4 is provided by imparting a gas dissolution function to a dilute chemical solution supply mechanism.

(Return Mechanism)

In the present embodiment, the washers 5A, 5B, and 5C are each connected to a return flow path 51 as a return mechanism that refluxes the dilute chemical solution to the reservoir 3, and the return flow path 51 is provided with a removal film 52 and an online monitor 53 that measures and displays the concentrations of the first chemical solution and/or the second chemical solution.

(Control Device)

In the above-described configuration, the first chemical solution supply mechanism 23, the second chemical solution supply mechanism 24, the flow meter of the dilute chemical solution preparation flow path 21, the level sensor 33, the opening/closing mechanism of the return flow path 34, and the online monitor 53 that detects the concentrations of the first chemical solution and the second chemical solution communicate with a control device such as a personal computer (not illustrated), and it is possible to control the opening and closing of the return flow path 34, the adjustment of the supply amounts from the first chemical solution supply mechanism 23 and the second chemical solution supply mechanism 24, and the like based on the flow volume in the dilute chemical solution preparation flow path 21 and the measured values of the level sensor 33 and the online monitor 53.

«Method of Supplying Dilute Chemical Solution»

A method of supplying the dilute chemical solution using the dilute chemical solution supply device as described above will then be described below.

(Dilute Chemical Solution Preparation Step)

In the dilute chemical solution preparation unit 2, the ultrapure water (DIW) W is supplied from the supply source 22 for the ultrapure water W, and the first chemical solution and the second chemical solution are supplied from the first chemical solution supply mechanism 23 and the second chemical solution supply mechanism 24, respectively. In this operation, the control device controls the plunger pump 23B and the plunger pump 24B to adjust the additive amounts of the first chemical solution and the second chemical solution based on the flow volume in the dilute chemical solution preparation flow path 21 so that the first chemical solution and the second chemical solution have predetermined concentrations.

In the present embodiment, preferred properties of the ultrapure water W as the raw water may be, for example, resistivity: 18.1 MΩ·cm or more, fine particles: 1000 particles/L or less with a particle diameter of 50 nm or more, viable bacteria: 1 bacterium/L or less, TOC (Total Organic Carbon): 1 µg/L or less, total silicon: 0.1 µg/L or less, metals: 1 ng/L or less, ions: 10 ng/L or less, hydrogen peroxide; 30 µg/L or less, and water temperature: 25±2° C.

One of the first chemical solution and the second chemical solution may be preferably, for example, a pH adjuster. The pH adjuster is not particularly limited, but when adjusting the pH to lower than 7, an acidic solution such as hydrochloric acid, nitric acid, sulfuric acid, or acetic acid can be used. When adjusting the pH to 7 or higher, an alkaline solution such as ammonia, sodium hydroxide, potassium hydroxide, or TMAH can be used.

The other of the second chemical solution and the first chemical solution may be preferably a redox potential adjuster. When adjusting the redox potential to a high level, hydrogen peroxide solution or the like can be used as the redox potential adjuster. When adjusting the redox potential to a low level, a solution of oxalic acid, hydrogen sulfide, potassium iodide, or the like can be used.

Both the first chemical solution and the second chemical solution may be added, or either one may otherwise be added. When either one is added, the second chemical solution supply mechanism 24 may not be provided. Thus, the desired dilute chemical solution W1 is prepared by using the control device to control the additive amount of either or both of the first chemical solution and the second chemical solution based on the flow volume of the ultrapure water W so that the predetermined concentrations are obtained.

(Storage Step)

The dilute chemical solution W1 thus prepared is supplied to the reservoir 3 without any modification. In this operation, the $N_2$ gas supply mechanism 31 constantly supplies $N_2$ gas having a constant pressure to fill the upper space of the reservoir 3 with the $N_2$ gas. This can suppress the fluctuations of the pH and the redox potential due to an increase in the dissolved gas in the dilute chemical solution W1 in the reservoir 3.

In the present embodiment, the reservoir 3 is provided with the level sensor 33 as illustrated in FIG. 3; therefore, if the amount of water held in the reservoir 3 falls below a certain level, the dilute chemical solution preparation unit 2 will be controlled based on the output of the level sensor 33 so as to start the production of the dilute chemical solution W1, and the dilute chemical solution W1 can thereby be produced efficiently. On the other hand, even when the water level of the reservoir 3 is a certain level or higher and the production unit is in a stopped state, the dilute chemical solution preparation unit 2 may continue to pass the ultrapure water W at a very small flow volume, and the inside of the system of the dilute chemical solution preparation unit 2 can thereby be kept clean. The ultrapure water which has passed through in this operation may be discharged or refluxed and merged to the supply source 22 side of the ultrapure water W.

Here, immediately after the production of the dilute chemical solution W1 is started in the dilute chemical solution preparation unit 2, the solute concentration of the dilute chemical solution W1 may not be stable and may fall outside a predetermined concentration range. Accordingly, the time required for the concentration of the prepared dilute chemical solution W1 to stabilize and the amount of processing may be preliminarily checked, then until that time or amount, the dilute chemical solution W1 may be discharged via the return mechanism 32 without being stored in the reservoir 3, and the solute concentration of the dilute chemical solution W1 stored in the reservoir 3 for supply can thereby be controlled accurately. What is discharged in this operation is wastewater, but the amount of water in the whole is very small. The discharge of the dilute chemical solution W1 may be performed such that the removal device 35 such as an ion-exchange resin column provided in the return flow path 34 as illustrated in FIG. 3 removes the first chemical solution component and/or the second chemical solution component and returns the dilute chemical solution W1 to the dilute chemical solution preparation unit 2 side thereby to reduce the amount of wastewater. Additionally or alternatively, sensors that measure the concentrations of the first chemical solution and/or the second chemical solution may be provided in the reservoir 3, and the dilute chemical solution W1 may be discharged until its solute concentration falls within a predetermined range.

(Dilute Chemical Solution Adjustment/Supply Step)

Subsequently, the booster pump 42 as a liquid transfer means provided downstream the reservoir 3 is used to transfer the dilute chemical solution W1 stored in the reservoir 3. In this operation of the present embodiment, adjustment of the washing water W2 is performed such that the gas removal film 44 removes the dissolved gas in the dilute chemical solution W1 and the gas dissolution film 43 then dissolves the gas supplied from the dissolution gas source 45. In this operation, it is preferred to control the flow volume of the gas supplied from the dissolution gas source 45 by the mass flow controller (MFC) 46 so that the washing water W2 has a predetermined dissolved gas concentration. As the dissolved gas, for example, hydrogen, ozone, $CO_2$, or the like may be selected in various ways depending on the purpose of washing. The washing water W2 obtained by adjusting the dilute chemical solution W1 in this way is supplied to the washers 5A, 5B, and 5C.

(Return Step)

Then, the excess washing water W2 not used in any of the washers 5A, 5B, and 5C is returned to the reservoir 3 via the return flow path 51. The excess washing water W2 does not cause a problem when returned to the reservoir 3 without any modification, but the online monitor 53 may check whether the concentrations of the first chemical solution and/or the second chemical solution drop below predetermined values due to the self-decomposition of an oxidant or the reaction with the chemical solution, and the control device may appropriately control the concentrations of the chemical solutions, which are added from the first chemical solution supply mechanism 23 and/or the second chemical solution supply mechanism 24 in the dilute chemical solution preparation unit 2, in accordance with the measured values by the online monitor 53.

By supplying the dilute chemical solution W1 (washing water W2) in this way, even when the single-wafer type washers 5A, 5B, and 5C are multi-chamber single-wafer type washers in which a number of valves are opened and closed irregularly, it is possible to realize the supply that can keep the liquid quality, which is extremely important in the washing/rinsing step, accurately and stably at a desired value, and it is also possible to significantly reduce the wasteful use of excess washing water W2 (dilute chemical solution W1), thus preventing the waste of the ultrapure water W.

Second Embodiment

The dilute chemical solution supply device according to the second embodiment of the present invention will then be described with reference to FIG. 4. The dilute chemical solution supply device of the present embodiment basically has the same configuration as that of the previously described first embodiment, so the same configurations will be denoted by the same reference numerals and the detailed description will be omitted.

Figure 4:
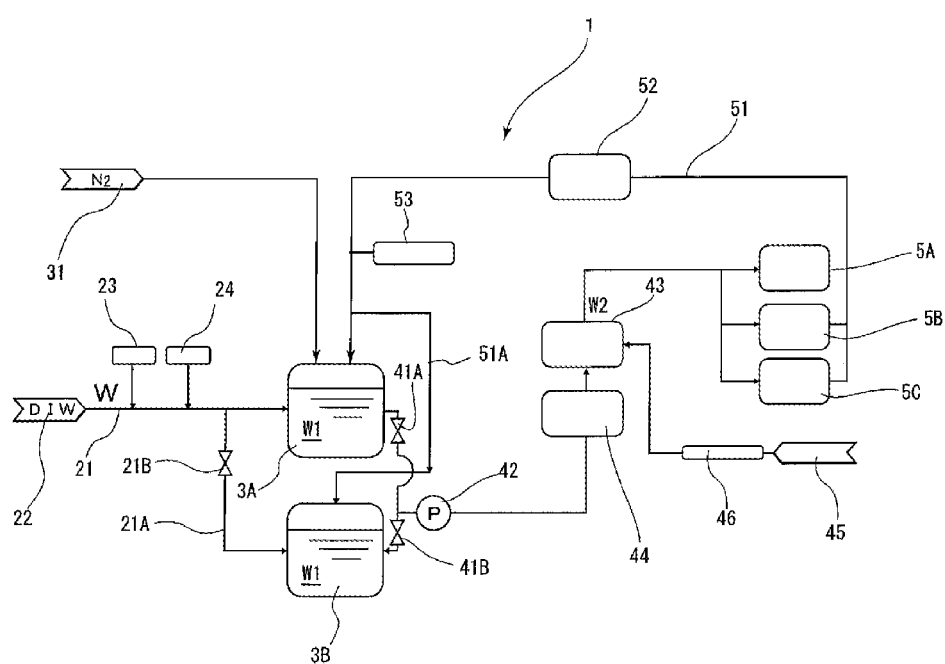
FIG. 4 is a flow diagram illustrating the dilute chemical solution supply device according to a second embodiment of the present invention.

In FIG. 4, the dilute chemical solution supply device is configured such that two reservoirs 3A and 3B are provided in parallel. In this configuration, a branch pipe 21A with an opening and closing valve 21B from the dilute chemical solution preparation flow path 21 is connected to the reservoir 3B while a branch pipe 51A from the return flow path 51 is connected to the reservoir 3B, and the dilute chemical solution supply flow path 41 is provided with switching valves 41A and 41B.

As in the present embodiment, two or more reservoirs are provided in parallel, and after one of the reservoirs (e.g., the reservoir 3A) is used to store the dilute chemical solution W1 from the dilute chemical solution preparation flow path 21, the opening and closing valve 21B is opened so as to supply the dilute chemical solution W1 to the reservoir 3B. Then, while the switching valve 41A is opened, the switching valve 41B is closed to sequentially send the washing water W2 from the reservoir 3A to the single-wafer type washers 5A, 5B and 5C, and during that time, the dilute chemical solution W1 is stored in the reservoir 3B which is waiting for the liquid transfer. Subsequently, each valve may be switched conversely to supply the dilute chemical solution W1 from the reservoir 3B and store the dilute chemical solution W1 in the reservoir 3A.

Thus, by providing a plurality of reservoirs for storing the dilute chemical solution W1 in parallel and switching between the reservoir for storing the dilute chemical solution W1 and the reservoir for supplying the dilute chemical solution W1, it is possible to achieve both the stabilized concentration and the stabilized supply of the dilute chemical solution W1.

Figure 5:
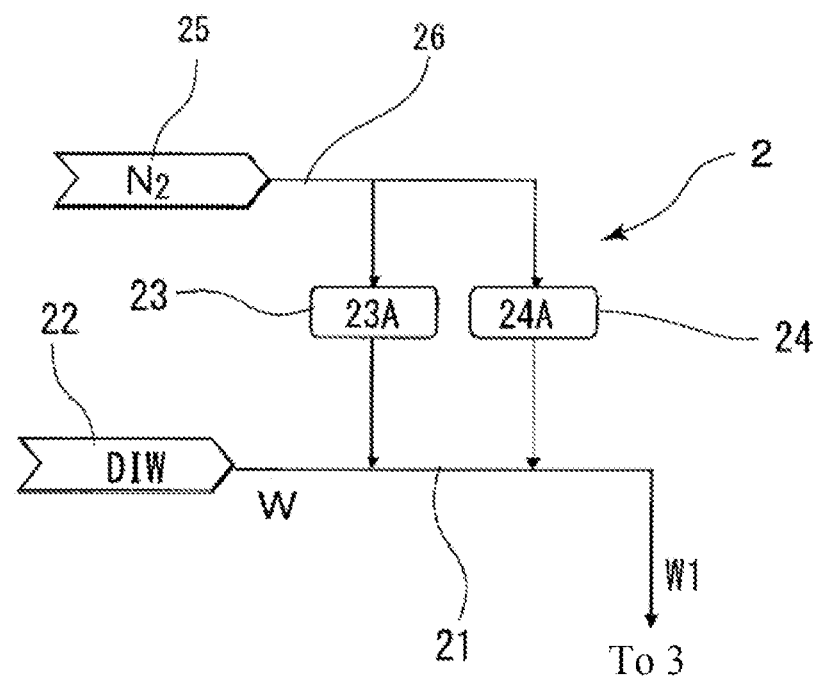
FIG. 5 is a flow diagram illustrating another example of the dilute chemical solution preparation unit.

While the dilute chemical solution supply device of the present invention has been described above based on the above embodiments, the present invention is not limited to the above embodiments and various modifications are possible. For example, the first chemical solution supply mechanism 23 and the second chemical solution supply mechanism 24 are not limited to those illustrated in FIG. 2, and as illustrated in FIG. 5, the first chemical solution tank 23A and the second chemical solution tank 23A may be provided as closed tanks, to which $N_2$ gas as an inert gas may be supplied from an $N_2$ gas supply source 25 via a supply pipe 26 to pressure-feed and dissolve the first chemical solution and the second chemical solution so that these solutions have desired solute concentrations.

In the dilute chemical solution adjustment/supply mechanism 4 of the present embodiment, the desired gas component is dissolved in the dilute chemical solution W1 by the gas dissolution film 43 to obtain the washing water W2, but the gas dissolution film 43 and the gas removal film 44 may not have to be used, and a dilute chemical solution supply mechanism may be simply configured such that the dilute chemical solution W1 is supplied without any modification as the washing water W2 or only the gas removal film 44 may be provided. Moreover, the use points are not limited to the single-wafer type washers and can be applied to devices using various dilute chemical solutions. Furthermore, while the present invention is suitable for a device having a plurality of use points using a dilute chemical solution, the present invention may be applied to a device using one dilute chemical solution.

DESCRIPTION OF REFERENCE NUMERALS

1 Dilute chemical solution supply device
2 Dilute chemical solution preparation unit
21 Dilute chemical solution preparation flow path
21A Branch pipe
21B Opening and closing valve
22 Ultrapure water supply source
23 First chemical solution supply mechanism
23A First chemical solution tank
23B Plunger pump
24 Second chemical solution supply mechanism
24A Second chemical solution tank
24B Plunger pump
25 $N_2$ gas (inert gas) supply source
26 Supply pipe
3,3A, 3B Reservoir
31 $N_2$ gas supply mechanism (inert gas supply mechanism)
32 Return mechanism
33 Level sensor
34 Return flow path
35 Removal device
4 Dilute chemical solution adjustment/supply mechanism
41 Dilute chemical solution supply flow path
41A, 41B Switching valve
42 Booster pump (liquid transfer pump)
43 Gas dissolution film
44 Gas removal film
45 Dissolution gas source
46 Mass flow controller (flow volume control means)
5A, 5B, 5C Single-wafer type washer
51 Return flow path
52 Gas removal film
53 Online monitor (concentration sensor)
W Ultrapure water
W1 Dilute chemical solution
W2 Washing water

The invention claimed is:

1. A dilute chemical solution supply device comprising:
a dilute chemical solution production unit comprising an ultrapure water source, at least one chemical solution tank configured to store a chemical solution, and at least one chemical solution pump that adds a predetermined amount of the chemical solution to a flow volume of ultrapure water thereby to produce a dilute chemical solution having a predetermined concentration of the chemical solution;
a reservoir that stores the produced dilute chemical solution;
a dilute chemical solution production flow path configured to communicate with the ultrapure water source, the at least one chemical solution pump, and the reservoir;
a dilute chemical solution supply mechanism comprising a supply pump and a supply flow path that supplies the dilute chemical solution to a use point; and
a return mechanism comprising: a return pipe that returns an excess dilute chemical solution at the use point to the reservoir; and a concentration monitor for the chemical solution component provided in a middle of the return pipe, wherein
the reservoir is provided with a discharge flow path configured to communicate with the dilute chemical solution production unit.

2. The dilute chemical solution supply device according to claim 1, wherein the dilute chemical solution supply mechanism is provided with a gas dissolution means comprising a dissolution gas source and a gas dissolution film that dissolves a predetermined gas component in the dilute chemical solution supplied from the reservoir.

3. The dilute chemical solution supply device according to claim 1, wherein the at least one chemical solution pump is a plunger pump that adds the chemical solution.

4. The dilute chemical solution supply device according to claim 1, wherein the at least one chemical solution tank is a closed tank that stores the chemical solution; and
the dilute chemical solution production unit further comprises an inert gas supply source that supplies an inert gas to the closed tank.

5. The dilute chemical solution supply device according to claim 1, wherein the reservoir is provided with a level sensor that detects a water level of the reservoir, and production/stop of the dilute chemical solution in the dilute chemical solution production unit can be controlled based on the water level information of the reservoir obtained by the level sensor.

6. The dilute chemical solution supply device according to claim 5, wherein a production amount of the dilute chemical solution in the dilute chemical solution production unit can be adjusted.

7. The dilute chemical solution supply device according to claim 2, wherein a gas removal film that removes a dissolved gas in the dilute chemical solution is provided upstream of the gas dissolution film.

8. The dilute chemical solution supply device according to claim 7, wherein the gas removal film is provided downstream of the reservoir.

9. The dilute chemical solution supply device according to claim 1, wherein
an ion-exchange resin column is provided on the discharge flow path, and
the discharge flow path is configured to communicate with the dilute chemical solution production unit downstream of the ion-exchange resin column.

10. A dilute chemical solution supply device comprising:
a dilute chemical solution production unit comprising an ultrapure water source, at least one chemical solution tank configured to store a chemical solution, and at least one chemical solution pump that adds a predetermined amount of the chemical solution to a flow volume of ultrapure water thereby to produce a dilute chemical solution having a predetermined concentration of the chemical solution;

a reservoir that stores the produced dilute chemical solution;

a dilute chemical solution supply mechanism comprising a supply pump and a supply flow path that supplies the dilute chemical solution to a use point; and a return mechanism comprising: a return pipe that returns an excess dilute chemical solution at the use point to the reservoir; and a concentration monitor for the chemical solution component provided in a middle of the return pipe, wherein the reservoir comprises two or more reservoirs that are provided in parallel.

11. The dilute chemical solution supply device according to claim 10, wherein the two or more reservoirs are provided upstream of the dilute chemical solution supply mechanism.

12. The dilute chemical solution supply device according to claim 10, wherein the supply flow path includes two or more switching valves, and each switching valve of the two or more switching valves is configured to communicate with one reservoir of the two or more reservoirs.

13. The dilute chemical solution supply device according to claim 10, wherein the two or more reservoirs comprise a first reservoir and a second reservoir;

the dilute chemical solution production unit further comprises a dilute chemical solution production flow path configured to communicate with the ultrapure water source and the at least one chemical solution pump, and a dilute chemical solution production branch pipe that branches from the dilute chemical solution production flow path;

the return mechanism further comprises a return branch pipe that branches from the return pipe;

the return pipe communicates with one of the first reservoir or the second reservoir via the return branch pipe; and the dilute chemical solution production flow path communicates with the one of the first reservoir or the second reservoir via the dilute chemical solution production branch pipe.

* * * * *